United States Patent
Tessier et al.

(10) Patent No.: US 10,811,846 B2
(45) Date of Patent: Oct. 20, 2020

(54) QUANTUM CASCADE LASER

(71) Applicants: CENTRE NATIONAL DE LA RECHERCHE SCIENTIFIQUE, Paris (FR); UNIVERSITE DE MONTPELLIER, Montpellier (FR)

(72) Inventors: Roland Tessier, Castelnau-le-Lez (FR); Alexei Baranov, Montpellier (FR)

(73) Assignees: CENTRE NATIONAL DE LA RECHERCHE SCIENTIFIQUE, Paris (FR); UNIVERSITE DE MONTPELLIER, Montpellier (FR)

( * ) Notice: Subject to any disclaimer, the term of this patent is extended or adjusted under 35 U.S.C. 154(b) by 0 days.

(21) Appl. No.: 16/081,588

(22) PCT Filed: Mar. 2, 2017

(86) PCT No.: PCT/EP2017/054857
§ 371 (c)(1),
(2) Date: Aug. 31, 2018

(87) PCT Pub. No.: WO2017/149057
PCT Pub. Date: Sep. 8, 2017

(65) Prior Publication Data
US 2019/0115728 A1 Apr. 18, 2019

(30) Foreign Application Priority Data
Mar. 3, 2016 (FR) .................................... 16 51796

(51) Int. Cl.
*H01S 5/34* (2006.01)
*H01S 5/20* (2006.01)

(52) U.S. Cl.
CPC .......... *H01S 5/3402* (2013.01); *H01S 5/2004* (2013.01); *H01S 5/2018* (2013.01); *H01S 5/3401* (2013.01)

(58) Field of Classification Search
CPC .... H01S 5/3402; H01S 5/2018; H01S 5/2004; H01S 5/3401
See application file for complete search history.

(56) References Cited

U.S. PATENT DOCUMENTS

| | | | | |
|---|---|---|---|---|
| 5,588,015 A | * | 12/1996 | Yang ..................... | B82Y 20/00 372/45.012 |
| 2010/0097690 A1 | * | 4/2010 | Vurgaftman .......... | B82Y 20/00 359/344 |

(Continued)

FOREIGN PATENT DOCUMENTS

JP 2004119814 11/2013

OTHER PUBLICATIONS

Gel'vich, É.A., Golant, E.I., Kuznetsova, I.V., Pashkovskii, A.B. 'A laser operating on coherent intersubband transitions with electron transfer to the valence band'. Technical Physical Letters, 1995, 29(7), 557-559. https://doi.org/10.1134/1.1598548.

(Continued)

*Primary Examiner* — Yuanda Zhang
(74) *Attorney, Agent, or Firm* — IP Attorneys Group, LLC

(57) ABSTRACT

The invention relates to a quantum cascade laser (300) comprising a gain region (102) inserted between two optical confinement layers (104₁, 104₂), said gain region (102) having an electron input into the gain region (102) and an electron output from said gain region (102) characterized in that said laser comprises a hole-blocking area (304) on the side of said electron output.

14 Claims, 2 Drawing Sheets

(56) References Cited

U.S. PATENT DOCUMENTS

| | | | | |
|---|---|---|---|---|
| 2012/0128018 A1* | 5/2012 | Vurgaftman | ........... | B82Y 20/00 |
| | | | | 372/45.01 |
| 2012/0269221 A1* | 10/2012 | Vurgaftman | .......... | H01S 5/3401 |
| | | | | 372/45.01 |
| 2012/0300804 A1* | 11/2012 | Bauer | ................... | H01S 5/3402 |
| | | | | 372/45.01 |
| 2013/0121361 A1* | 5/2013 | Bauer | ................... | H01S 5/3422 |
| | | | | 372/50.22 |
| 2014/0247850 A1* | 9/2014 | Botez | .................... | H01S 5/2013 |
| | | | | 372/45.012 |
| 2017/0125979 A1* | 5/2017 | Yang | ..................... | H01S 5/3403 |

OTHER PUBLICATIONS

Spencer, P.S., Shore, K.A., 'Quantum well structures for intersubband semiconductor lasers'. International Journal of Optoelectronics, 1995, 10(5), 393-400.

Vitiello, M.S., Scamarcio, G., Spagnolo, V., Yang, Q., Manz, C. Wagner, J., Revin, D.G., Cockburn, J. 'Electronic and thermal properties of Sb-based QCLs operating in the first atmospheric window'. Proceedings of SPIE—The International Society for Optical Engineering, 2007, 6485, 648508-648511. https://doi.org/10.1117/12.698576.

\* cited by examiner

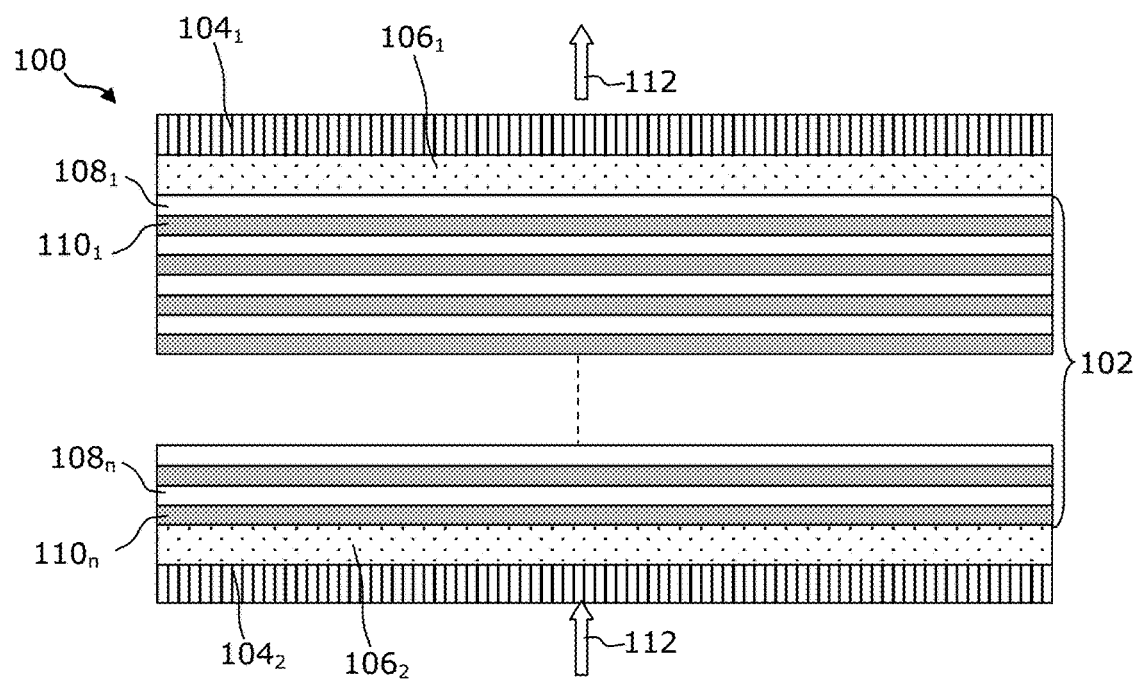
FIG. 1
FIG. 2
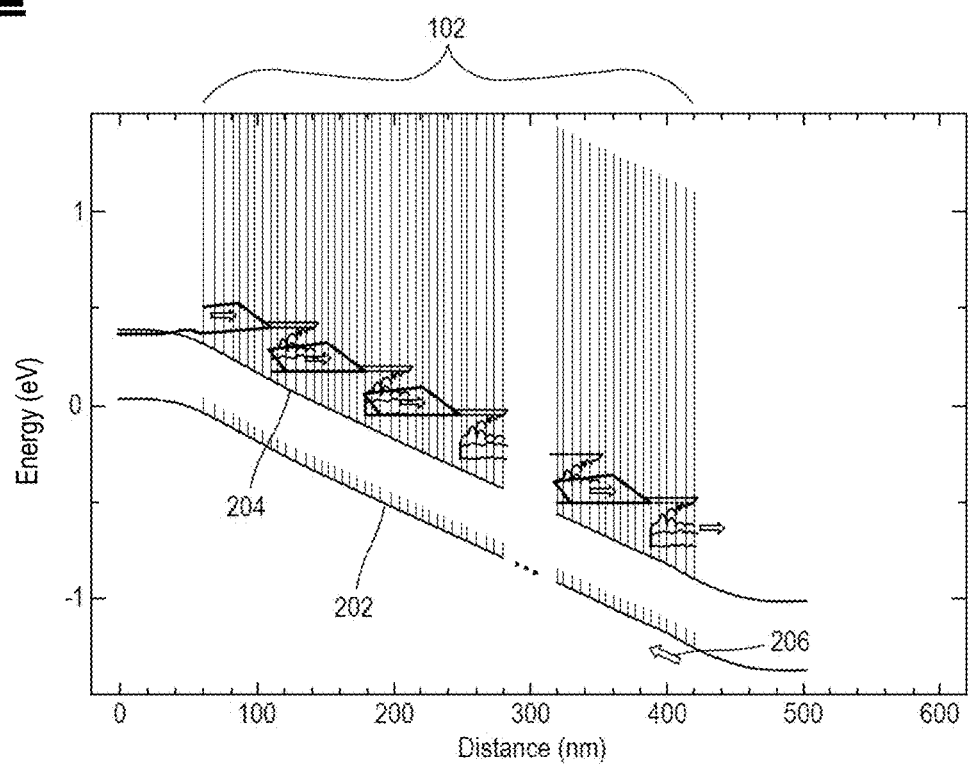

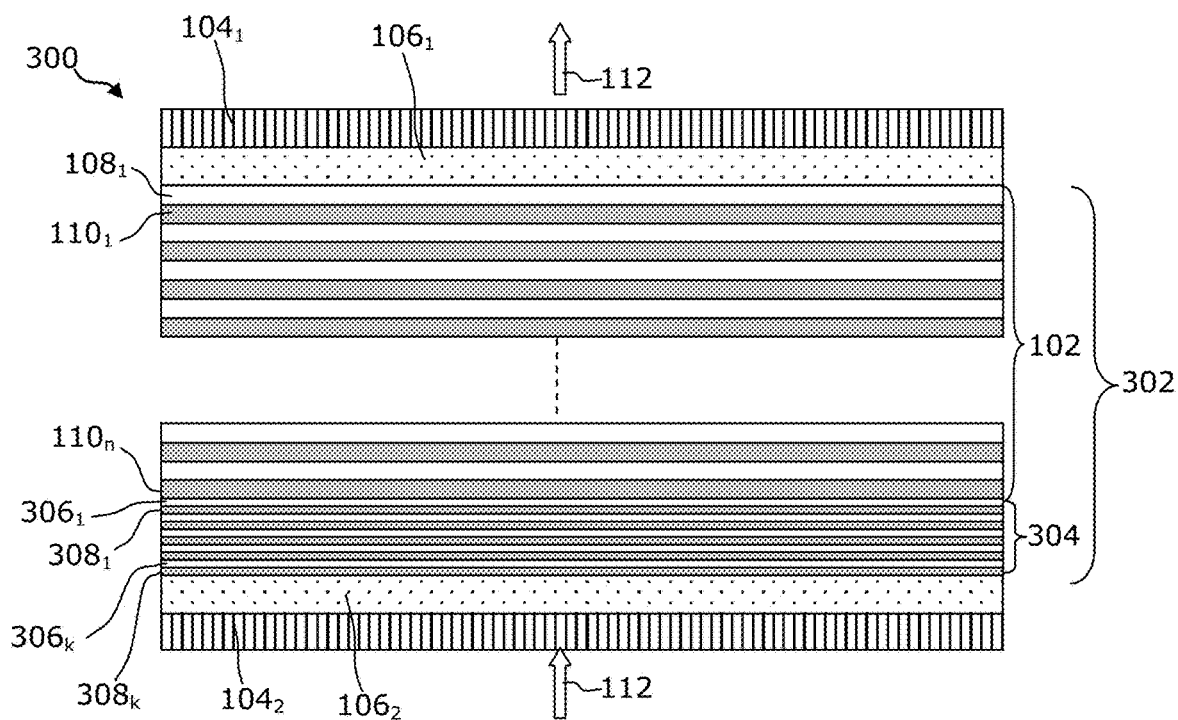
FIG. 3
FIG. 4
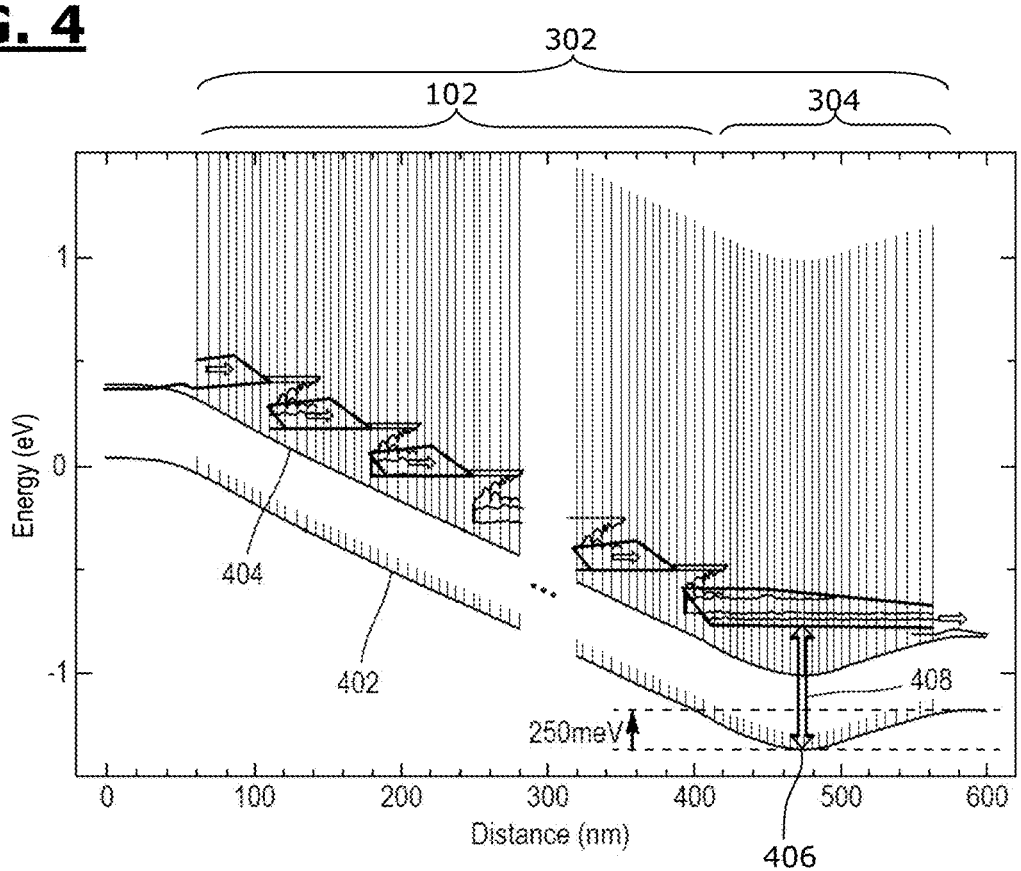

QUANTUM CASCADE LASER

CROSS-REFERENCE TO RELATED APPLICATIONS

This application is a national phase entry of International Application No. PCT/EP2017/054857, having a filing date of Mar. 2, 2017, and titled "Quantum Cascade Laser," which is claims priority to and the benefit of French application No. 1651796 having a filing date of Mar. 3, 2016, and titled "Quantum Cascade Laser." The contents of the above-identified Applications are relied upon and incorporated herein by reference in their entirety.

The present invention relates to a quantum cascade laser.

The field of the invention is the field of semiconductor lasers, and more particularly the field of quantum cascade lasers.

STATE OF THE ART

Quantum cascade lasers are lasers produced on the basis of a semiconductor heterostructure constituted by a gain region formed by a multi-quantum well structure inserted between two confinement layers, also called "cladding", forming an optical waveguide. A passive layer with a low optical absorption, called "spacer", can be placed between the gain region and the confinement layer.

The gain region is generally composed of a stack of an assembly of pairs of layers comprising one well layer and one barrier layer.

This structure is pumped by an electric current flowing perpendicularly to the layers of which it is composed. The electric field in the gain region can reach a very high value, of the order of 10 kV/cm to more than 100 kV/cm.

However, quantum cascade lasers suffer from a parasitic current, also called "hole current", which degrades the performance of the laser, in particular at ambient temperature. This current is formed by holes, generated in the area of output of the electrons from the gain region, which propagate in the gain region.

In addition, the hole current is thermally activated and can be reinforced by a mechanism of ionization by impact of holes.

The value of the parasitic current increases as the energy of the forbidden band of the material used decreases.

An aim of the present invention is to overcome these drawbacks.

A further aim of the invention is to propose a quantum cascade laser having a lower hole current, or none at all.

An aim of the invention is also to propose a quantum cascade laser having better performance, in particular at ambient temperature.

A further aim of the invention is also to propose a quantum cascade laser the performance of which is less degraded, even when the energy of the forbidden band of the material used is low.

DISCLOSURE OF THE INVENTION

The invention makes it possible to achieve at least one of these aims by a quantum cascade laser comprising a gain region inserted between two optical confinement layers, said gain region having an electron input to the gain region and an electron output from said gain region.

According to the invention, the quantum cascade laser comprises a hole-blocking area.

Thus, the invention proposes a quantum cascade laser equipped with an area for blocking the propagation of the holes in said laser. As a result, the holes generated in said laser, and in particular in the valence band of said laser, can no longer propagate in the gain region, in particular from the electron output from the gain region to the electron input into the gain region. As the propagation of the holes is blocked by the barrier formed by the hole-blocking area, the hole current in the gain region is very low, or even zero.

Thus the invention makes it possible to obtain a quantum cascade laser having better performance, in particular at ambient temperature. In addition, the performance of such a quantum cascade laser is less degraded, even when the energy of the forbidden band of the material used to produce the laser according to the invention is low.

Preferentially, the hole-blocking area can be arranged on the side of the electron output from the gain region.

More particularly, the hole-blocking area can be arranged at the junction of the gain region with a confinement layer, or with a passive layer of the spacer type.

Preferentially, the hole-blocking area can have a valence band energy profile which decreases to reach a local minimum, then increases, in the direction going from the electron input into the gain region to the electron output from the gain region.

Such an energy profile constitutes an effective barrier against the propagation of holes in the gain region.

In the case of an area constituted by a stack of well layers and barrier layers, by "valence-band energy profile" is meant the profile obtained by the position of the valence band in the well layers/materials, excluding the energy discontinuities due to the barrier layers/materials.

In a non-limitative embodiment, downstream of the local minimum, in the direction going from the electron input to the electron output, the valence-band energy profile in the hole-blocking area can increase by a predetermined value greater than or equal to the thermal energy at ambient temperature, in particular greater than or equal to 25 meV, and preferentially greater than or equal to 50 meV In other words, the energy increase of the valence band after the local minimum can have a predetermined value greater than or equal to the thermal energy at the maximum envisaged operating temperature.

According to a preferred, but non-limitative, embodiment the predetermined value is greater than or equal to 25 meV.

According to a preferred, but non-limitative, embodiment the predetermined value is greater than or equal to 50 meV.

The energy values given above are particularly suitable when the material used for the well layer is InAs, without being limited to this material.

Such an energy increase makes it possible to create an effective energy barrier against the propagation of holes in the gain region. The holes are thus confined downstream of the local minimum and cannot pass upstream of the local minimum.

According to a preferred version, the hole-blocking area can have an effective forbidden band energy which increases, reaches a maximum value, then decreases in the direction going from the electron input into the gain region to the electron output from the gain region.

In the present invention, the "effective forbidden band energy" represents the sum of the forbidden band energy between the valence band and the conduction band of the well material, the confinement energy of the first level of electrons and the confinement energy of the first level of holes.

According to an embodiment, the gain region and the hole-blocking area can each comprise a stack of well layers and barrier layers, and in particular a repetition of pairs of layers composed of one well layer and one barrier layer.

In an advantageous version of the laser according to the invention, the thickness of at least one well layer of the hole-blocking area can be less than the thickness of at least one well layer in the gain region.

The fact that the hole-blocking area contains well layers of smaller thickness with respect to the gain region makes it possible to create a local minimum in the energy profile of the valence band, respectively a local maximum in the effective forbidden band energy.

According to a particularly advantageous embodiment of the invention, the thickness of the well layers of the hole-blocking area can decrease to reach a minimum, then increase, in the direction going from the electron input into the gain region to the electron output from the gain region.

In particular, the decrease, respectively the increase, in the thickness of the well layers in the hole-blocking area can be progressive or discontinuous.

More particularly, the well layers of the hole-blocking area can have a thickness which:
- decreases progressively from a value, called starting value, corresponding to the thickness of a well layer, and in particular of the last well layer, in the gain region, to reach a value, called minimum value, corresponding to one half of said starting value;
- then, increases progressively starting from said minimum value to reach a value, called end value, greater than or equal to said starting value.

In particular, the thickness of at least one well layer of the hole-blocking area can be less than or equal to 80%, and more particularly less than or equal to 50%, of the thickness of at least one well layer of the gain region.

The inventors have noted that a minimum well layer thickness in the hole-blocking area equal to 50% of the well layer maximum thickness in the gain region makes it possible to obtain an effective barrier against the propagation of the holes in the gain region.

Alternatively, or in addition to what has been described above for the well layers, the thickness of at least one barrier layer of the hole-blocking area can advantageously be greater than the thickness of at least one barrier layer in the gain region.

The fact that the hole-blocking area contains barrier layers of greater thickness with respect to the gain region makes it possible to create a local minimum in the energy profile of the valence band, respectively a local maximum in the effective forbidden band energy.

According to a particularly advantageous embodiment, the thickness of the barrier layers in said hole-blocking area can increase to reach a local maximum, then decrease, in the direction going from the electron input into the gain region to the electron output from the gain region.

In particular, the increase, respectively the decrease, in the thickness of the barrier layers in the hole-blocking area can be progressive or discontinuous.

More particularly, the barrier layers of the hole-blocking area can have a thickness which:
- increases progressively from a value, called starting value, corresponding to the thickness of a barrier layer, and in particular of the last barrier layer, in the gain region, to reach a value, called maximum value, corresponding to the double of said starting value;
- then, decreases progressively starting from said maximum value to reach a value less than or equal to said starting value.

In particular, the thickness of at least one barrier layer of the hole-blocking area can be greater than or equal to 150%, and more particularly greater than or equal to 200%, of the thickness of at least one barrier layer in the gain region. The inventors have noted that a maximum thickness of the barrier layer in the hole-blocking area equal to 200% of the minimum thickness of the barrier layer in the gain region makes it possible to obtain an effective barrier against the propagation of the holes in the gain region.

Preferentially, in the hole-blocking area, at least one, in particular each, well layer or barrier layer can be N-doped.

The N-doping can be greater at the centre of the hole-blocking area, with respect to the start and the end of said hole-blocking area.

As described above, the gain region, respectively the hole-blocking area, can be formed by a stack of several well layers and several barrier layers alternately.

According to a preferred, but non-limitative, embodiment, each well layer of the gain region, respectively the hole-blocking area, can be produced from Indium Arsenide (inAs).

According to a preferred, but non-limitative, embodiment, each barrier layer of the gain region, respectively of the hole-blocking area, can be produced from Aluminium Antimonide (AlSb).

According to a first version of the laser according to the invention, when the gain region is produced by a stack of well layers and barrier layers, and in particular by a stack of superimposed pairs of layers composed of one well layer and one barrier layer, then the hole-blocking area can be formed by a sub-assembly of said stack of layers on the side of the electron output, and in particular at the level of the junction of said gain region with a confinement layer, or with a passive layer of the spacer type.

According to a second version, the hole-blocking area can be present in the form of a stack of layers, independent of the gain region.

Such an independent hole-blocking area can be placed:
- in direct contact with the gain region, or
- in indirect contact with the gain region, for example via an injector.

The hole-blocking area can for example be located between the gain region and a spacer, on the side of the electron output from said gain region.

According to another embodiment, the hole-blocking area may not be formed by a stack of several well and barrier layers.

In this embodiment, the hole-blocking area can be formed by a single layer, produced from an alloy the composition of which varies continuously, in order to reproduce the energy profile of the valence band, and/or the energy profile of the effective forbidden band, described above.

Such an alloy can be an alloy composed on the basis of a material with a low-energy forbidden band, for example Indium Arsenide (InAs) and a material with a high-energy forbidden band, for example Aluminium Antimonide (AlSb).

Such an alloy can in particular have a ratio R defined as:

$R$=(content of material with a low-energy forbidden band)/(content of material with a high-energy forbidden band)

the value of which decreases progressively from a starting value, to reach a minimum value, then increases to reach a value, called end value, in particular greater than or equal to said starting value.

The quantum cascade laser can be used in order to generate an optical wave with a wavelength greater than or equal to 3 µm, in particular greater than or equal to 12 µm, and even more particularly greater than or equal to 15 µm.

The laser according to the invention can be used for detection, measurement and/or monitoring of traces of gas, such as for example for pollution monitoring, for control applications, for a medical purpose or for compliance with legal requirements, as such a laser emits radiation that is not absorbed by clean, or unpolluted, air.

The laser according to the invention can advantageously be used for molecular spectroscopy, allowing in particular the detection, measurement and/or monitoring of:
drugs such as cocaine, heroin, cannabis;
sulphur hexafluoride (SF6) or uranium hexafluoride;
volatile organic compounds, such as furan or formic acid;
compounds used for the manufacture of explosives; or
nitrogen oxides.

DESCRIPTION OF THE FIGURES AND EMBODIMENTS

Other advantages and characteristics of the invention will become apparent on examination of the detailed description of an embodiment which is in no way limitative, and the attached drawings, in which:

FIG. 1 is a diagrammatic representation of an embodiment of a quantum cascade laser of the state of the art;

FIG. 2 is a diagrammatic representation of the band structure of the laser in FIG. 1.

FIG. 3 is a diagrammatic representation of an embodiment of a quantum cascade laser according to the invention; and FIG. 4 is a diagrammatic representation of the band structure of the laser in FIG. 3.

It is well understood that the embodiments which will be described hereinafter are in no way limitative. Variants of the invention can be considered comprising only a selection of the characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In the figures, the elements common to several figures retain the same reference.

FIG. 1 is a diagrammatic representation of an embodiment of a quantum cascade laser of the state of the art.

The laser 100 shown in FIG. 1 contains a gain region 102 placed between two confinement layers $104_1$ et $104_2$, made from a material having a lower optical index than that of the gain region, for example of N-doped InAs type, also called "cladding", forming an optical waveguide.

The gain region 102 and each confinement layer $104_1$ and $104_2$ has a thickness of the order of several microns, typically 2 to 5.

The laser 100 can also contain, between the gain region 102 and each confinement layer, respectively $104_1$ and $104_2$, a layer, respectively $106_1$ and $106_2$, having a very low optical absorption, also called "spacer", produced for example with lightly doped InAs.

Each spacer $106_1$ and $106_2$ has a thickness of the order of several µm, typically 1 to 3.

The gain region 102 is formed by stacks of pairs of layers comprising one well layer 108$_i$ and one barrier layer $110_i$, with $1<i<n$, with n an integer, for example equal to 400. Each well layer 108 is produced from Indium Arsenide (InAs) and each barrier layer 110 is produced from AlSb.

Each well layer 108 has a thickness of the order of 8 nm. Of course, the thickness of the well layers in the gain region 102 can be variable.

In addition, each barrier layer 110 has a thickness of the order of 0.5 nm. Of course, the thickness of the barrier layers in the gain region 102 can be variable.

In operation, an electric current is pumped in a direction perpendicular to the layers 104-110. In the example shown in FIG. 1, the current 112 enters the laser on the side of the layers $104_2$ and $106_2$, and exits the laser 100 on the side of the layers $104_1$ and $106_1$. As a result, the charge carriers, i.e. the electrons, enter the gain region 102 on the side of the layers $104_1$ and $106_1$, and exit the gain region 102 on the side of the layers $104_2$ and $106_2$.

FIG. 2 is a diagrammatic representation of the structure of the band of energies of the laser in FIG. 1, in operation.

The y axis gives the energy level with respect to distance, corresponding to the thickness of the gain region 102, the 60 nm point corresponding to the electron input into the gain region 102, i.e. the first layer $108_1$ of the gain region 102, and the distance 420 nm corresponding to the electron output in the gain region 102, i.e. the last layer $110_n$ of the gain region.

Thus, it is noted that the energy profile 202 of the valence band is a monotonic and decreasing profile, if the energy discontinuities of the valence band in the barrier layers $110_i$ are excluded. The same observation applies to the energy profile 204 of the conduction band.

Under these conditions, a population of holes appears in the valence band, on the side of the electron output, i.e. on the side of the layer $110_n$, by inter-band thermal generation or impact ionization. The holes generated then pass through the valence band of the electron output to the electron input, which causes the occurrence of a hole current represented by the arrow 206 in FIG. 2.

This hole current 206 is a parasitic current and degrades the performance of the quantum cascade laser 100.

FIG. 3 is a diagrammatic representation of a non-limitative embodiment of a laser according to the invention.

The laser 300 according to the invention comprises all the elements of the laser 100 in FIG. 1.

In particular, the laser 300 comprises the gain region 102 of the laser 100 in FIG. 1.

The laser 300 comprises in addition to the gain region 102, a hole-blocking area 304, placed between the gain region 102 and the spacer $106_2$, the gain region 102 and the hole-blocking area forming, both, an area 302, located between the spacers $106_1$ and $106_2$. The purpose of this hole-blocking area 304 is to block the propagation of holes in the valence band from the electron output from the area 302 to the electron input of the gain region 102.

The hole-blocking area 304 is formed by stacks of pairs of layers comprising one well layer $306_i$ and one barrier layer $308_i$, with $1<i<k$, with k an integer, for example equal to 30. Each well layer $306_i$ is produced from Indium Arsenide (InAs) and each barrier layer $308_i$ is produced from AlSb.

In addition, the well layers $306_i$ of the hole-blocking area 304 can have a thickness which:
- decreases progressively from a value, called starting value, corresponding to the thickness of a well layer $108_i$ in the gain region 102 to reach a value, called minimum value, corresponding, for example, to one half of the starting value;
- then, increases progressively starting from said minimum value to reach a value greater than or equal to said starting value.

In particular, the first well layer $306_1$ of the hole-blocking area 304 has a thickness equal to the last well layer $108_n$ of the gain region 102, for example of the order of 8 nm. In addition, the last well layer $306_k$ of the hole-blocking area 304 has a thickness greater than or equal to that of the first well layer $306_1$ of the hole-blocking area 304. Between the first well layer $306_1$ and the last well layer $306_k$ of the hole-blocking area 304, the thickness of the well layers $306_i$ decreases to reach a minimum value, for example 4 nm, for example at a well layer located in the centre of the hole-blocking area 304, then increases to reach a value greater than or equal to the thickness of the first well layer $306_1$ of the hole-blocking area 304, for example a value of the order of 8 nm, at the last well layer $306_k$ of the hole-blocking area 304.

In addition, or alternatively, the barrier layers $308_i$ of the hole-blocking area 304 can have a thickness which:
- increases progressively from a value, called starting value, corresponding to the thickness of a barrier layer $110_i$ in the gain region 102 to reach a value, called maximum value, corresponding, for example, to double the starting value;
- then, decreases progressively starting from said maximum value to reach a value at most equal to the starting value.

In particular, the first barrier layer $308_1$ of the hole-blocking area 304 has a thickness equal to the last barrier layer $110_n$ of the gain region 102, for example of the order of 0.5 nm. In addition the last barrier layer $308_k$ of the hole-blocking area 304 has a thickness less than or equal to that of the first barrier layer $308_1$ of the hole-blocking area 304. Between the first barrier layer $308_1$ and the last barrier layer $308_k$ of the hole-blocking area 304, the thickness of the barrier layers $308_i$ increases to reach a maximum value, for example 1 nm, for example at the barrier layer $308_i$ located in the centre of the hole-blocking area 304, then decreases to reach a value less than or equal to the thickness of the first barrier layer $308_1$ of the hole-blocking area 304, for example a value of the order of 0.5 nm, at the last barrier layer $308_k$ of the hole-blocking area 304.

In addition, each well layer $306_i$ or each barrier layer $308_i$ of the hole-blocking area can be of N-doped type. The doping is maximum in the central part of the hole-blocking area 304.

In the example which has just been described, the thickness of the well layers and the barrier layers of the hole-blocking area varies. Of course, the invention is not limited to this embodiment. For example, it is possible to envisage a laser according to the invention in which only the thickness of the well layers, respectively of the barrier layers, of the hole-blocking area has the variation described above.

Moreover in the example which has just been described, the hole-blocking area is formed by a stack of well layers and barrier layers. Of course, the invention is not limited to this embodiment. For example, it is possible to envisage a hole-blocking area in the form of a single layer, produced from an alloy the composition of which varies continuously.

Such a hole-blocking area can be produced by an alloy of well material, for example Indium Arsenide (InAs), and of barrier material, for example Aluminium Antimonide (AlSb), the ratio of which (content of well material)/(content of barrier material) decreases progressively, from a starting value, to reach a minimum value, then increases to reach an end value, greater than or equal to said starting value.

FIG. 4 is a diagrammatic representation of the structure of the bands of energies of the laser in FIG. 3, in operation.

The y axis gives the energy level with respect to distance, corresponding to the thickness of the region 302, the 60 nm point corresponding to the electron input into the gain region 102, i.e. at the first layer $108_1$ of the gain region 102, and the 420 nm point corresponding to the barrier layer $110_n$ and to the well layer $306_1$, i.e. to the start of the hole-blocking area 304. The 560 point nm corresponds to the end of the hole-blocking area 304, and thus to the end of the region 302.

Thus, if the energy band discontinuities in the barrier layers $110_i$ and $308_i$ are excluded, it is noted that the energy profile 402 of the valence band:
- decreases to reach a local minimum 406 at a central part of the hole-blocking area 304, and in particular at the 470 nm point;
- then increases to reach the energy level corresponding to the start of the hole-blocking area.

The energy increase after the local minimum 406 is of the order of 250 meV in the example shown in FIG. 4.

In other words, the effective forbidden band energy is progressively increased, starting from the effective forbidden band energy of the output from the gain region 102, to reach a maximum value 408, then progressively decreases to a value close to the forbidden band of the adjacent spacer region $106_2$.

Therefore, in operation, the local minimum 406 of the energy profile 402 of the valence band, respectively the local maximum of the effective forbidden band energy 408, constitutes a potential barrier in the valence band, which opposes the propagation of holes generated in said valence band on the side of the electron output from the region 302, i.e. on the side of the layer $308_k$.

The holes generated in the valence band remain blocked downstream of said local minimum 406 of the energy profile 402 of the valence band, respectively of the local maximum 408 of the effective forbidden band energy. In other words, the holes generated in the valence band remain blocked between said minimum, respectively said maximum, and the electron output from the region 302.

Of course, the invention is not limited to the examples detailed above.

In particular, other materials can be used for the well layers and the barrier layers. Similarly, the number of layers, the dimensions of the layers and the energy values indicated are in no way limitative

What is claimed is:

1. A quantum cascade laser comprising a gain region inserted between two optical confinement layers, said gain region having an electron input into the gain region and an electron output from said gain region, characterized in that said laser comprises a hole-blocking area on the side of said electron output, said hole-blocking area having a valence-band energy profile, which decreases to reach a local minimum, then increases, in the direction going from the electron input into the gain region to the electron output from the gain region.

2. The laser according to claim 1, characterized in that, downstream of the local minimum, in the direction going from the electron input to the electron output, the valence-band energy in the hole-blocking area increases by a value greater than or equal to the thermal energy at ambient temperature, in particular greater than or equal to 25 meV.

3. The laser according to claim 1, characterized in that the hole-blocking area has an effective forbidden band energy which increases, reaches a maximum value, then decreases in the direction going from the electron input into the gain region to the electron output from the gain region.

4. The laser according to claim 1, characterized in that the gain region and the hole-blocking area each contain a stack of well layers and barrier layers, a thickness of at least one well layer of the hole-blocking area being less than a thickness of at least one well layer in the gain region.

5. The laser according to claim 4, characterized in that the thickness of the well layers in the hole-blocking area decreases to reach a minimum then increases, in the direction going from the electron input into the gain region to the electron output from the gain region.

6. The laser according to claim 4, characterized in that the thickness of at least one well layer of the hole-blocking area is less than or equal to 80%, and more particularly 50%, of the thickness of at least one well layer of the gain region.

7. The laser according to claim 1, characterized in that the gain region and the hole-blocking area each contain a stack of well layers and barrier layers, a thickness of at least one barrier layer of the hole-blocking area being greater than a thickness of at least one barrier layer in the gain region.

8. The laser according to claim 7, characterized in that the thickness of the barrier layers in the hole-blocking area increases to reach a maximum then decreases, in the direction going from the electron input into the gain region to the electron output from the gain region.

9. The laser according to claim 7, characterized in that the thickness of at least one barrier layer of the hole-blocking area is greater than or equal to 150%, and more particularly greater than or equal to 200%, of the thickness of at least one barrier layer in the gain region.

10. The laser according to claim 1, characterized in that the gain region contains a stack of well layers and barrier layers, and in that in the hole-blocking area at least one, in particular each, well layer or barrier layer is of N-doped type.

11. The laser according to claim 1, characterized in that the gain region, respectively the hole-blocking area, is formed by a stack of several well layers and several barrier layers alternately, and in that:
  each well layer is produced from Indium Arsenide; and/or
  each barrier layer is produced from Aluminium Antimonide (AlSb).

12. The laser according to claim 1, characterized in that the gain region comprises a stack of well layers and barrier layers, the hole-blocking area being formed by a sub-assembly of said stack of layers on the side of the electron output.

13. The laser according to claim 1, characterized in that the hole-blocking area is formed in the form of a stack of layers, independent of the gain region.

14. The laser according to claim 1, characterized in that the hole-blocking area is formed in the form of a single layer, produced from an alloy, a composition of which varies continuously.

* * * * *